(12) United States Patent
Damjanovic et al.

(10) Patent No.: US 11,769,844 B2
(45) Date of Patent: *Sep. 26, 2023

(54) PHOTOVOLTAIC DEVICE INCLUDING A P-N JUNCTION AND METHOD OF MANUFACTURING

(71) Applicant: First Solar, Inc., Tempe, AZ (US)

(72) Inventors: Dan Damjanovic, Boise, ID (US); Feng Liao, Perrysburg, OH (US); Rick Powell, Ann Arbor, MI (US); Rui Shao, Sylvania, OH (US); Jigish Trivedi, Pleasanton, CA (US); Zhibo Zhao, Novi, MI (US)

(73) Assignee: First Solar, Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/505,291

(22) Filed: Oct. 19, 2021

(65) Prior Publication Data

US 2022/0045226 A1    Feb. 10, 2022

Related U.S. Application Data

(60) Division of application No. 16/363,499, filed on Mar. 25, 2019, now abandoned, which is a continuation of
(Continued)

(51) Int. Cl.
*H01L 31/044*    (2014.01)
*H01L 31/0296*    (2006.01)
(Continued)

(52) U.S. Cl.
CPC ...... *H01L 31/02966* (2013.01); *H01L 31/073* (2013.01); *H01L 31/1832* (2013.01);
(Continued)

(58) Field of Classification Search
CPC .................. H01L 31/00–078; Y20E 10/50–60
See application file for complete search history.

(56) References Cited

U.S. PATENT DOCUMENTS 3,496,024 A    2/1970  Ruehrwein
3,565,686 A    2/1971  Babcock et al.
(Continued)

FOREIGN PATENT DOCUMENTS

AU    2012200546 A1    8/2012
CN    101079454 A    11/2007
(Continued)

OTHER PUBLICATIONS

Muthukumarasamy et al., Vauum, 84, 2010, 1216-1219 (Year: 2010).*
(Continued)

*Primary Examiner* — Bach T Dinh
(74) *Attorney, Agent, or Firm* — MacMillan, Sobanski & Todd, LLC

(57) ABSTRACT

A photovoltaic device includes a substrate structure and a p-type semiconductor absorber layer. A photovoltaic device may include a CdSeTe layer. A process for manufacturing a photovoltaic device includes forming a CdSeTe layer over a substrate. The process includes forming a p-type cadmium selenide telluride absorber layer.

32 Claims, 10 Drawing Sheets

Related U.S. Application Data application No. 15/612,078, filed on Jun. 2, 2017, now Pat. No. 10,243,092, which is a division of application No. 14/171,020, filed on Feb. 3, 2014, now Pat. No. 9,698,285.

(60) Provisional application No. 61/780,073, filed on Mar. 13, 2013, provisional application No. 61/759,458, filed on Feb. 1, 2013.

(51) Int. Cl.
    *H01L 31/073* (2012.01)
    *H01L 31/18* (2006.01)

(52) U.S. Cl.
    CPC ........ *H01L 31/1864* (2013.01); *Y02E 10/543* (2013.01); *Y02P 70/50* (2015.11)

(56) References Cited

U.S. PATENT DOCUMENTS

| | | | |
|---|---|---|---|
| 4,296,188 A * | 10/1981 | Hodes | H01L 21/02425 429/111 |
| 4,368,216 A | 1/1983 | Manassen et al. | |
| 4,382,118 A | 5/1983 | Oka | |
| 4,388,483 A | 6/1983 | Basol et al. | |
| 4,436,558 A | 3/1984 | Russak | |
| 4,568,792 A | 2/1986 | Mooney et al. | |
| 4,614,891 A | 9/1986 | Kuwahata et al. | |
| 4,682,212 A | 7/1987 | Inuiya et al. | |
| 5,279,678 A | 1/1994 | Jordan et al. | |
| 5,578,502 A | 11/1996 | Albright et al. | |
| 5,909,632 A | 6/1999 | Gessert | |
| 6,379,767 B1 | 4/2002 | Park et al. | |
| 6,488,770 B1 | 12/2002 | Meissner et al. | |
| 6,537,845 B1 | 3/2003 | McCandless et al. | |
| 7,518,207 B1 | 4/2009 | Chen et al. | |
| 7,812,249 B2 | 10/2010 | King et al. | |
| 7,985,919 B1 | 7/2011 | Roscheisen et al. | |
| 8,084,682 B2 | 12/2011 | Chen | |
| 8,198,117 B2 | 6/2012 | Leidholm et al. | |
| 8,309,387 B2 | 11/2012 | Forehand | |
| 8,426,722 B2 | 4/2013 | Munteanu et al. | |
| 8,653,616 B2 | 2/2014 | Kamada et al. | |
| 9,276,154 B2 | 3/2016 | Damjanovic et al. | |
| 9,698,285 B2 | 7/2017 | Damjanovic et al. | |
| 10,062,800 B2 | 8/2018 | Blaydes et al. | |
| 10,141,473 B1 | 11/2018 | Blaydes et al. | |
| 10,243,092 B2 | 3/2019 | Damjanovic et al. | |
| 10,461,207 B2 | 10/2019 | Damjanovic et al. | |
| 10,529,883 B2 | 1/2020 | Damjanovic et al. | |
| 10,784,397 B2 | 9/2020 | Blaydes et al. | |
| 11,164,989 B2 | 11/2021 | Andreini et al. | |
| 11,588,069 B2 | 2/2023 | Andreini et al. | |
| 2003/0070707 A1 | 4/2003 | King et al. | |
| 2004/0063320 A1 | 4/2004 | Hollars | |
| 2004/0261841 A1 | 12/2004 | Negami et al. | |
| 2005/0041571 A1 | 2/2005 | Ichihara et al. | |
| 2006/0213550 A1 | 9/2006 | Yamazaki et al. | |
| 2007/0000537 A1 | 1/2007 | Leidholm et al. | |
| 2007/0295390 A1 | 12/2007 | Sheats et al. | |
| 2008/0092945 A1 | 4/2008 | Munteanu et al. | |
| 2008/0110498 A1 | 5/2008 | Zafar et al. | |
| 2008/0152868 A1 | 6/2008 | Sato et al. | |
| 2008/0156365 A1 | 7/2008 | Scholz et al. | |
| 2008/0223430 A1 | 9/2008 | Krasnov et al. | |
| 2008/0251119 A1 | 10/2008 | Forehand | |
| 2009/0020149 A1 | 1/2009 | Woods et al. | |
| 2009/0025640 A1 | 1/2009 | Sager et al. | |
| 2009/0235986 A1 | 9/2009 | Hotz et al. | |
| 2009/0242029 A1 | 10/2009 | Paulson et al. | |
| 2009/0261438 A1 | 10/2009 | Choi et al. | |
| 2010/0180935 A1 | 7/2010 | Chen | |
| 2010/0186815 A1 | 7/2010 | Yang et al. | |
| 2010/0186816 A1 | 7/2010 | Park et al. | |
| 2010/0206381 A1 | 8/2010 | Aida et al. | |
| 2010/0236607 A1 | 9/2010 | Korevaar et al. | |
| 2010/0243039 A1 | 9/2010 | Korevaar et al. | |
| 2010/0273287 A1 | 10/2010 | Weiner et al. | |
| 2010/0326489 A1 | 12/2010 | Ahn | |
| 2011/0005594 A1 | 1/2011 | Powell et al. | |
| 2011/0011983 A1 | 1/2011 | King et al. | |
| 2011/0024876 A1 | 2/2011 | Bower et al. | |
| 2011/0081743 A1 | 4/2011 | Kawano | |
| 2011/0139227 A1 | 6/2011 | Sivananthan et al. | |
| 2011/0139240 A1 | 6/2011 | Allenic et al. | |
| 2011/0214709 A1 * | 9/2011 | Evelsizer | H01L 31/072 257/E31.124 |
| 2011/0220191 A1 | 9/2011 | Flood | |
| 2011/0247687 A1 | 10/2011 | Zhang et al. | |
| 2011/0265865 A1 | 11/2011 | Korevaar | |
| 2011/0272744 A1 | 11/2011 | Ning et al. | |
| 2011/0277838 A1 | 11/2011 | Ma et al. | |
| 2011/0290308 A1 | 12/2011 | Korevaar | |
| 2011/0318941 A1 | 12/2011 | Schmidt et al. | |
| 2012/0017977 A1 | 1/2012 | Satou et al. | |
| 2012/0052617 A1 | 3/2012 | Johnson et al. | |
| 2012/0067392 A1 | 3/2012 | Gloeckler | |
| 2012/0073637 A1 | 3/2012 | Fujdala et al. | |
| 2012/0090661 A1 | 4/2012 | Capps et al. | |
| 2012/0132256 A1 | 5/2012 | Sager | |
| 2012/0132268 A1 | 5/2012 | Rojo et al. | |
| 2012/0138129 A1 | 6/2012 | Kim et al. | |
| 2012/0156828 A1 | 6/2012 | Peng et al. | |
| 2012/0180844 A1 | 7/2012 | Ward, III | |
| 2012/0192923 A1 | 8/2012 | Korevaar et al. | |
| 2012/0192930 A1 | 8/2012 | Fox et al. | |
| 2012/0192948 A1 | 8/2012 | Basol | |
| 2012/0313200 A1 | 12/2012 | Jackrel et al. | |
| 2013/0000726 A1 | 1/2013 | Skarp | |
| 2013/0037100 A1 | 2/2013 | Platzer Bjorkman et al. | |
| 2013/0068279 A1 | 3/2013 | Buller et al. | |
| 2013/0074912 A1 | 3/2013 | Walukiewicz et al. | |
| 2013/0074921 A1 | 3/2013 | Tang et al. | |
| 2013/0081670 A1 | 4/2013 | Ashley et al. | |
| 2013/0104985 A1 | 5/2013 | Korevaar et al. | |
| 2013/0109124 A1 | 5/2013 | Peng et al. | |
| 2013/0280854 A1 | 10/2013 | Jasieniak et al. | |
| 2014/0065763 A1 * | 3/2014 | Foust | H01L 31/03925 257/E31.015 |
| 2014/0216542 A1 | 8/2014 | Shao et al. | |
| 2014/0216550 A1 | 8/2014 | Damjanovic et al. | |
| 2014/0261667 A1 | 9/2014 | Buller et al. | |
| 2014/0273334 A1 | 9/2014 | Christensen et al. | |
| 2014/0326315 A1 | 11/2014 | Blaydes et al. | |
| 2014/0360565 A1 | 12/2014 | Blaydes et al. | |
| 2014/0373908 A1 | 12/2014 | Duggal et al. | |
| 2015/0214403 A1 | 7/2015 | Wu et al. | |
| 2016/0126396 A1 | 5/2016 | Damjanovic et al. | |
| 2019/0221685 A1 | 7/2019 | Damjanovic et al. | |
| 2020/0058818 A1 | 2/2020 | Damjanovic et al. | |
| 2021/0399159 A1 | 12/2021 | Andreini et al. | |
| 2023/0045333 A1 | 2/2023 | Andreini et al. | |

FOREIGN PATENT DOCUMENTS

| | | |
|---|---|---|
| CN | 102244110 A | 11/2011 |
| CN | 102365707 A | 2/2012 |
| CN | 102365752 A | 2/2012 |
| CN | 102484170 A | 5/2012 |
| CN | 103222032 A | 7/2013 |
| EP | 0248953 A1 | 12/1987 |
| EP | 0300799 A2 | 1/1989 |
| EP | 1378591 B1 | 3/2009 |
| EP | 2381482 A1 | 10/2011 |
| EP | 2482329 A2 | 8/2012 |
| EP | 2954562 A2 | 12/2015 |
| WO | 2007129097 A2 | 11/2007 |
| WO | 2008136872 A2 | 11/2008 |
| WO | 2010031010 A1 | 3/2010 |
| WO | 2010110467 A1 | 9/2010 |
| WO | 2011036458 A2 | 3/2011 |
| WO | 2012002381 A1 | 1/2012 |
| WO | 2012045113 A1 | 4/2012 |

(56) References Cited

FOREIGN PATENT DOCUMENTS

| WO | WO2012045113 | * | 4/2012 |
|----|--------------|---|--------|
| WO | 2012094537 A3 | | 7/2012 |
| WO | 2014123806 A2 | | 8/2014 |
| WO | 2014151610 A1 | | 9/2014 |
| WO | 2014179652 A1 | | 11/2014 |

OTHER PUBLICATIONS

Burgelman et al. "Modelling polycrystalline semiconductor solar cells", Thin Solid Films, 2000, vol. 361-362, pp. 527-532.
Chanda, "Copper doped window layer for CdSe colar cells", Graduate School Theses and Dissertations, University of South Florida, 2008, pp. 1-74.
Duenow et al., "CdS/CdTe Solar Cells Containing Directly Deposited CdSxTe1-x Alloy Layers", Presented at the 37th IEEE Photovoltaic Specialists Conference, Seattle, Washington, Jun. 19-24, 2011, pp. 1-8.
Gloeckler et al., "Numerical Modeling of Cigs and CdTe Solar Cells: Setting the Baseline", Photovoltaic Energy Conversion, 2003, Proceedings of the 3rd World Conference, May 11-18, 2003, pp. 1-6.
Gur et al., "Air-Stable All-Inorganic Nanocrystal Solar Cells Processed from Solution", Science, 2005, vol. 310, pp. 462-465.
MacDonald et al., "Layer-by-Layer Assembly of Sintered CdSexTe1-x Nanocrystal Solar Cells", American Chemical Society NANO, 2012, vol. 6, No. 7, pp. 5995-6004.
McCandless et al., "Cadmium Telluride Solar Cells", Handbook of Photovoltaic Science and Engineering, 2003, pp. 617-662.
Murali et al., "Electrical Properties of Sintered CdSxSe1-x Films", Chalcogenide Letters, 2008, vol. 5, No. 9, pp. 181-186.
Moori, "Optical Characteristics of CdSSe Films Prepared by Thermal Evaporation Technique", Baghdad Science Journal, 2011, vol. 8, No. 1, pp. 155-160.
Oladeji et al., "Metal/CdTe/CdS/Cd1-xZnxS/TCO/glass: A new CdTe thin film solar cell structure", Solar Energy Materials & Solar Cells, 2000, vol. 61, pp. 203-211.
Tanaka et al., "Zinc and Selenium Co-doped CdTe Substrates Lattice Matched to HgCdTe", Journal of Crystal Growth, 1989, vol. 94, pp. 166-170.
Toyama et al., "Doping effects of dimethyl-tin-dichloride on material properties of CdS films and on formation of CdS/CdTe heterostructures". Journal of Applied Physics, 2005, vol. 98, pp. 1-6.
Wei et al., "First-Principles Calculation of Band Offsets, Optical Bowings, and Defects in CdS, CdSe, CdTe, and Their Alloys", Journal of Applied Physics, 2000, vol. 87, pp. 1304-1311.
Muthukumarasamy et al., "Fabrication and characterization of n-CdSe 0.7 Te 0.3 /p-CdSe 0.15 Te 0.85 solar cell", Elsevier, Vacuum, 2010, vol. 84, pp. 1216-1219.
Chinese First Office Action, Application No. CN201480037816.X, dated Aug. 4, 2017.
Chinese Second Office Action, Application No. 201480037816.X, dated Jan. 17, 2018.
Chinese First Office Action, Application No. CN201480045027.0, dated Nov. 4, 2016.
Chinese First Office Action, Application No. CN201580072252.8, dated Jun. 21, 2018.
Chilean Office Action, Application No. CL201503219, dated Oct. 16, 2017.
Chilean Second Office Action, Application No. CL 201503219, dated Mar. 14, 2018.
Extended European Search Report, Application No. EP14807775.3, dated Jan. 5, 2017.
Extended European Search Report, Application No. EP14791065.7, dated Nov. 17, 2016.
European Examination Report, Application No. 14791065.7, dated Jan. 22, 2018.
PCT International Search Report and the Written Opinion, Application No. PCT/US2014/014414, dated Jul. 30, 2014.
PCT International Search Report and the Written Opinion, Application No. PCT/US2014/036501, dated Sep. 5, 2014.
PCT International Search Report and the Written Opinion, Application No. PCT/US2014/036503, dated Sep. 5, 2014.
PCT International Search Report and the Written Opinion, Application No. PCT/US/2015/015387, dated Jun. 23, 2015.
Chinese Final Office Action, Application No. 201480045027.0, dated Jun. 15, 2017.
Chinese First Office Action, Application No. 201710890967.5, dated Dec. 5, 2018.
IJAE Search and Examination Report, KIPO examination office, Appln. No. UAE/P/1618/2015, dated Nov. 19, 2019.
Chinese 2nd Office Action, Appln. No. CN 201710890967.5 dated Nov. 5, 2019.
Chinese 3rd Office Action, Appln. No. CN 201710890967.5, dated Apr. 10, 2020.
Chinese 2nd Office Action, Appln. No. CN 201580072252.8, dated Apr. 29, 2019.
Extended European Search Report, Appln. No. EP 19190580.1, dated Sep. 12, 2019.
European Examination Report, Appln. No. EP 14791065.7, dated Oct. 16, 2019.
European Examination Report, Appln. No. EP 15706121.9, dated Oct. 21, 2019.
First Examination Report, Indian Appln. No. 201717014215, dated May 20, 2020.
First Examination Report, Indian Appln. No. 11893/DELNP/2015, dated Aug. 13, 2019.
First Examination Report, Indian Appln. No. 10489/DELNP/2015, dated May 28, 2019.
Intellectual Property India, Hearing Notice, dated Apr. 30, 2021, Indian Patent Application No. 11893/DELNP/2015.
Extended European Search, dated Sep. 20, 2022, European Patent Application No. 22177362.5.
United Arab Emirates Examination and Search Report, dated Nov. 11, 2019, searched by Korean Intellectual Property Office (KIPO), Application No. UAE/P/1483/2015.
European Patent Office Summons to Oral Proceedings, dated May 2, 2022, Application No. 19190580.1.
Chinese First Office Action, dated May 26, 2023, Application No. 202010966136.3.

* cited by examiner

PHOTOVOLTAIC DEVICE INCLUDING A P-N JUNCTION AND METHOD OF MANUFACTURING

CROSS-REFERENCE TO RELATED APPLICATIONS

The present application is a divisional of U.S. patent application Ser. No. 16/363,499, filed on Mar. 25, 2019, which is a continuation of U.S. patent application Ser. No. 15/612,078, filed on Jun. 2, 2017, now U.S. Pat. No. 10,243,092, which is a divisional of U.S. patent application Ser. No. 14/171,020, filed on Feb. 3, 2014, now U.S. Pat. No. 9,698,285, which claims the benefit of U.S. Provisional Patent Application No. 61/780,073, filed on Mar. 13, 2013 and U.S. Provisional Patent Application No. 61/759,458, filed on Feb. 1, 2013. Each of the aforementioned applications is incorporated by reference herein.

BACKGROUND

Disclosed embodiments relate generally to photovoltaic devices and, in particular, to photovoltaic devices having a p-n junction.

A photovoltaic structure generates electrical power by converting light into direct current electricity using semiconductor materials that exhibit the photovoltaic effect. The photovoltaic effect generates electrical power upon exposure to light as photons, packets of energy, are absorbed within the semiconductor to excite electrons to a higher energy state. These excited electrons are thus able to conduct and move freely within the material. When an electron is displaced within the material, a 'hole' forms where the electron was previously bound to a particular atom of the material.

A basic unit of photovoltaic structure, commonly called a cell, may generate only small scale electrical power. Thus, multiple cells may be electrically connected to aggregate the total power generated among the multiple cells within a larger integrated device, called a module, or a panel. A photovoltaic module may further comprise a protective back layer and encapsulant materials to protect the included cells from environmental factors. Multiple photovoltaic modules or panels can be assembled together to create a photovoltaic system, or array, capable of generating significant electrical power up to levels comparable to other types of utility-scale power plants. In addition to photovoltaic modules, a utility-scale array would further include mounting structures, electrical equipment including inverters, transformers, and other control systems. Considering various levels of device, from individual cell to utility-scale arrays containing a multitude of modules, all such implementations of the photovoltaic effect may contain one or more photovoltaic structures to accomplish the energy conversion.

To generate power from sunlight, the active area of a photovoltaic structure or device generally includes a bi-layer of two distinct regions, one above the other and each containing one or more materials, where each material may further contain added impurities. The result is that one region in the photovoltaic device is n-type, having an excess of negatively charged electrons, while the other is p-type, having an excess of positively charged holes. These regions are commonly named the window layer, for the n-type region, and the absorber layer, for the p-type region. Where these two regions abut one another, a p-n junction is formed. The window layer is preferred to be as thin as possible in order to allow the maximum amount of light to reach the absorber layer, yet it also needs to be sufficiently thick to maintain a robust p-n junction with the absorber layer.

When photons create free electrons and holes, collectively called charge carriers, near the p-n junction, the internal electric field of the junction causes the electrons to move towards the n side of the junction and the holes towards the p side thereby generating an electrical charge potential. A front contact, electrically connected to the window layer, and a back contact, electrically connected to the absorber layer can provide pathways through which the electrical charge potential can flow to become an electrical current. Electrons can flow back to the p-side via an external current path, or circuit.

When two or more separate materials are used to create the p-n junction, the interface or interfaces between the materials can affect the efficient performance of the photovoltaic device. Where the materials have formed crystalline grains, the grain boundary separating the two abutting materials can scatter the electrons and holes and prevent them from flowing across the p-n junction. While moving within the material where generated, such as may occur after being scattered by a grain boundary, mobile electrons and holes may recombine. This reduces the total number of charge carriers available to generate current flow within the device and the overall conversion efficiency. Efficiency, in this instance, refers to the electrical power or energy generated by the PV device compared to the equivalent energy of photons incident on the device.

The manufacturing of a photovoltaic structure generally includes sequentially forming the functional layers through process that may include vapor transport deposition, atomic layer deposition, chemical bath deposition, sputtering, closed space sublimation, or any other suitable process that creates the desired material. Once a layer is formed it may be desirable to modify the physical characteristics of the layer through subsequent activation processes. For example, an activation step may include passivation, which is defect repair of the crystalline grain structure, and may further include annealing. Imperfections or defects in the crystalline grain disrupt the periodic structure in the layer and can create areas of high resistance or current loss.

An activation process may accomplish passivation through the introduction of a chemical dopant to the semiconductor bi-layer as a bathing solution, spray, or vapor. Subsequently annealing the layer in the presence of the chemical dopant at an elevated temperature provides grain growth and incorporation of the dopant into the layer. The larger grain size reduces the resistivity of the layer, allowing the charge carriers to flow more efficiently. The incorporation of a chemical dopant may also make the regions of the bi-layer more n-type or more p-type and able to generate higher quantities of mobile charge carriers. Each of these improves efficiency by increasing the maximum voltage the device can produce and reducing unwanted electrically-conductive regions.

In the above activation process, the summary parameters of anneal temperature, chemical bath composition, and soak time, for a particular layer depend on that layer's material and may have adverse effects on other layers present in the photovoltaic structure. For example, during the activation step of the absorber layer, the high temperature anneal may cause the window layer to flux into and intermix with the absorber layer, which can lead to the window layer having a non-uniform thickness or becoming discontinuous, which decreases device performance. It would be desirable to use more chemically potent doping solution, higher annealing temperatures, or longer anneal duration in an activation step to more aggressively treat the absorber layer, as this would increase the benefits conferred on the absorber layer by the activation step. However, using more aggressive process conditions during the activation step can cause more fluxing, thus further degrading or destroying the window layer, which decreases device performance.

This problem cannot be solved by simply increasing the initial thickness of the window layer so that if some of the material is fluxed away during the activation step, enough remains to maintain a good junction. This apparent remedy causes other problems as the window layer will absorb some photons and having a thicker window layer after the activation step reduces the available light for photon harvesting at the absorber layer. In general, it is desired to have a very thin window layer to provide better light transmission to the absorber layer.

Therefore, it is desirable to provide an efficient p-n junction between layers of different semiconductor materials, incorporating an absorber layer that can be activated with an aggressive activation step while maintaining the integrity of a thin window layer, and a method of making such a photovoltaic structure.

BRIEF DESCRIPTION OF THE DRAWINGS

The above, as well as other advantages of the present disclosure, will become readily apparent to those skilled in the art from the following detailed description of a preferred embodiment when considered in the light of the accompanying drawings in which.

DETAILED DESCRIPTION

The following detailed description and appended drawings describe and illustrate various exemplary embodiments. The description and drawings serve to enable one skilled in the art to make and use the embodiments described herein and are not intended to limit the scope of the present disclosure in any manner. In respect of the methods disclosed, the steps presented are exemplary in nature and, thus, the order of the steps is not necessary or critical.

Figure 1:
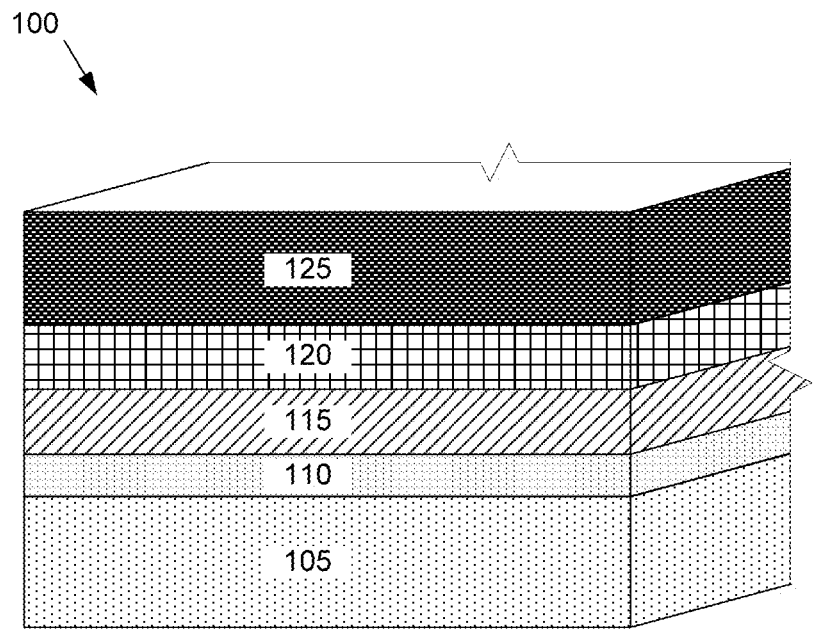
FIG. 1 depicts a schematic of functional layers in a typical prior art photovoltaic device.

Photovoltaic devices generally comprise multiple layers of material. FIG. 1 depicts a photovoltaic device 100. Photovoltaic device 100 may include a base layer 105, a transparent conductive oxide (TCO) layer 110, a window layer 115 made from an n-type cadmium sulfide (CdS) semiconductor material, an absorber layer 120 made from a p-type cadmium telluride (CdTe) semiconductor material, and a metal back contact 125. Photovoltaic devices may further include electrical connections, not shown, that provide a current path to communicate generated current flow, such as from one photovoltaic cell to adjacent cells in a module or from one photovoltaic module to adjacent modules in an array. Alternatively, the electrical connections may communicate the current flow to an external load device where the photogenerated current provides power.

Each of the layers described in the following embodiments may be composed of more than one layer or film. Additionally, each layer can cover all or a portion of the device and/or all or a portion of the layer or material underlying the layer. For example, a "layer" can mean any amount of material that contacts all or a portion of a surface. During a process to form one of the layers, the created layer forms on an outer surface, typically a top surface, of a substrate or substrate structure. A substrate structure may include a base layer introduced into a deposition process and any other or additional layers that may have been deposited onto the base layer in a prior deposition process. Layers may be deposited over the entirety of a substrate with certain portions of the material later removed through laser ablation, scribing, or other material-removal process.

Figure 2:
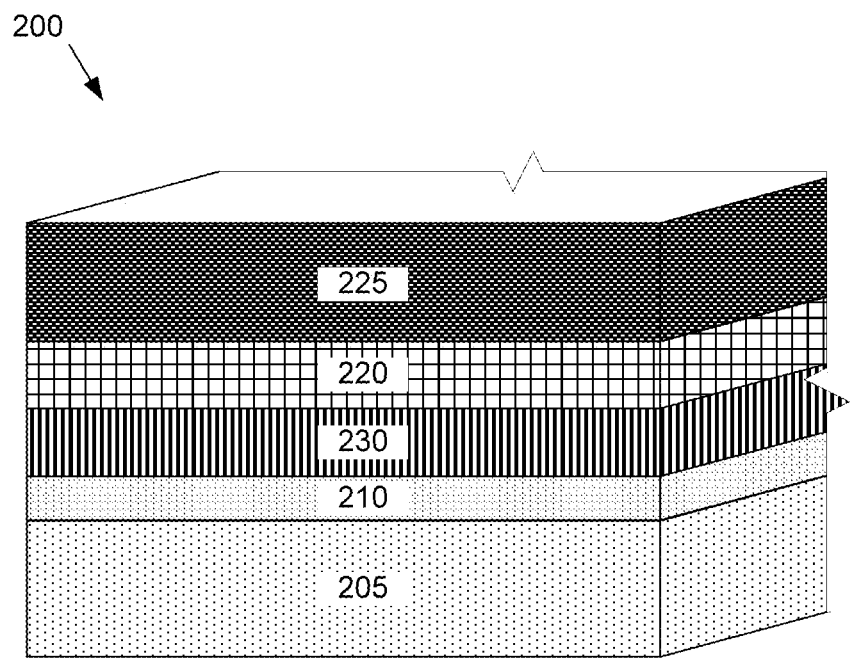
FIG. 2 depicts a schematic of functional layers in a first embodiment of a photovoltaic device.

Several specific embodiments of a novel photovoltaic device will be described with reference to the figures. The novel photovoltaic device according to the disclosed embodiments can include material compositions, or interfacial layers to achieve high performance efficiency in the p-n junction. In a first embodiment of a photovoltaic device 200 according to the present disclosure as depicted in FIG. 2, an n-type window layer 230 comprising cadmium sulphoselenide (CdSSe) is deposited over a substrate structure including a base layer 205 and a TCO layer 210. A p-type absorber layer 220 is deposited over the CdSSe layer 230. The CdSSe layer 230 and the p-type absorber layer 220 form a p-n junction in the photovoltaic device 200. A metal back contact 225 is formed over the p-type absorber layer 220.

The base layer 205 may include glass, for example, soda lime glass or float glass. Alternatively, the base layer 205 may include polymeric, ceramic, or other materials that provide a suitable structure for forming a base of photovoltaic cell. Preferably, the base layer 205 transmits light through its thickness with minimal or no absorption or reflection of photons. The base layer 205 may have additional layers applied (not shown) that promote the transmission of photons through its thickness, which may include anti-reflective coatings or anti-soiling coatings. The base layer 205 may have additional layers applied (not shown) that promote the chemical stability of the glass, which may include buffer or barrier layers that inhibit the diffusion of chemical ions from, into, or across the glass substrate. The base layer 205 provides a substrate surface upon which further layers of material are formed to create the photovoltaic device.

The TCO layer 210 allows light to pass through to a semiconductor window layer 215 while serving as an ohmic electrode to transport photogenerated charge carriers away from the light absorbing material. The TCO layer 210 may include tin oxide, zinc oxide, cadmium stannate, doped variations thereof, or any other suitable material. The TCO layer 210 can be formed over the base layer 205 through various deposition methods including chemical vapor deposition, molecular beam deposition, sputtering, spray pyrolysis, and other conventional methods.

A metal back contact 225 is provided opposite to the TCO layer 210, sandwiching the semiconductor layers of the photovoltaic device 200. The metal back contact 225 serves as a second ohmic electrode to transport photogenerated charge carriers. The metal back contact 225 can include electrically conductive materials, such as metallic silver, nickel, copper, aluminum, titanium, palladium, chrome, molybdenum, gold, or combinations thereof. The metal back contact 225 can be formed on the semiconductor layers through various deposition methods including chemical vapor deposition, molecular beam deposition, sputtering, spray pyrolysis, and other conventional methods.

The TCO layer 210 may form or may be electrically connected to a front contact. The metal back contact 225 may form or may be electrically connected to a back contact. The front contact forms a current path through which the electrical current generated by the active layers of the photovoltaic device may flow. The back contact forms a second current path through which generated current may flow. The front contact may connect one photovoltaic cell to an adjacent cell in one direction within a photovoltaic module or, alternatively, to a terminal of the photovoltaic module. Likewise, the back contact may connect the photovoltaic cell to a terminal of the photovoltaic module or, alternatively, to an adjacent cell in a second direction within the photovoltaic module, forming a series configuration. The front contact or back contact may connect the photovoltaic cell to an external terminal of the photovoltaic module in which it is located.

According to this first embodiment, the n-type CdSSe layer 230 forms the window layer, that is, the n-type region of the p-n junction within the photovoltaic device 200. The thickness of the CdSSe layer 230 can be between 10 nm to 100 nm thick or alternatively between 30 nm and 75 nm thick. The CdSSe layer 230 may be composed of cadmium, sulfur and selenium in varying amounts to form a $CdS_{1-x}Se_x$ compound, where x is in the range of about 1 to 25 at %, or alternatively between about 5 to 10 at %. The compositional ratio (at %) of a compound, for example $CdS_{1-x}Se_x$, is determined by comparing the number of sulfur atoms and the number of selenium atoms in a given amount of the compound with the total sum of sulfur and selenium atoms in the given amount. For example, where x=10 at %, there are 9 sulfur atoms for every 1 selenium atom in a given amount of $CdS_{90\%}Se_{10\%}$ compound.

The CdSSe layer 230 can be manufactured by a deposition process, such as vapor transport deposition, atomic layer deposition, chemical bath deposition, sputtering, closed space sublimation, or any other suitable process. In forming the CdSSe layer 230 using a process requiring the evaporation of powder, such as vapor transport deposition, the CdSSe layer 230 may be formed from the co-evaporation of a blended mixture of CdS and cadmium selenide (CdSe) powder, or the evaporation of a pre-alloyed CdSSe powder. The composition of the blended powders for co-evaporation or the composition of a pre-alloyed powder can be tailored so that the as-deposited film achieves the desired $CdS_{1-x}Se_x$ compositional ratio. Alternatively, a CdSSe layer may be formed by sequentially depositing a CdS layer followed by depositing a CdSe layer with a subsequent annealing or heat treatment process to allow alloying of the two layers to achieve the desired $CdS_{1-x}Se_x$ compositional ratio. The annealing or heat treatment process may be a separate step in a manufacturing process or may occur concurrently with the subsequent deposition of a further layer of the photovoltaic device, for example the deposition of the p-type absorber layer 220.

Although the disclosed embodiments may describe a CdSSe layer as a single layer within the device, in each case the CdSSe layer may comprise multiple layers of CdSSe of varying composition to form a continuous or step-wise gradient of the sulfur to selenium ratio. For example, the CdSSe layer 230 may be formed as a single layer of $CdS_{1-x}Se_x$ where x is held constant throughout the formation process. Alternatively, the CdSSe layer 230 may be formed sequentially as multiple layers of $CdS_{1-x}Se_x$ where x varies in value for each of the sequentially formed layers. For example, a first $CdS_{1-x}Se_x$ layer may be deposited where x=5 at %, and a second $CdS_{1-x}Se_x$ layer may be deposited where x=10 at %. These two adjacent layers may together form the CdSSe layer 230. As a further alternative, the ratio of sulfur to selenium may be varied continuously throughout the formation process so that, for example, the composition of the formed $CdS_{1-x}Se_x$ layer at a first end is x=5 at % and at a second end is x=10 at %, and where x varies continuously from 5 at % to 10% between the first and second ends. The whole of the formed layer having the continuous gradient may form the CdSSe layer 230.

The p-type absorber layer 220 may include a p-type semiconductor material to form the p-type region of the p-n junction within the photovoltaic device 200. The absorber layer 220 preferably absorbs photons passing through from the CdSSe window layer 230 to mobilize charge carriers. The absorber layer 220 may be formed of CdTe. An absorber layer 220 formed of CdTe may further include impurities or dopants in the CdTe bulk material. The absorber layer 220 may be between 500 nm to 8000 nm thick, or alternatively between 1000 nm to 3500 nm thick. The absorber layer 220 may be formed over the CdSSe window layer 230 by a deposition process, such as vapor transport deposition, atomic layer deposition, chemical bath deposition, sputtering, closed space sublimation, or any other suitable process. In the following alternative embodiments, similar layers as those described in the first embodiment are included and similarly numbered (incremented by 100).

Figure 3:
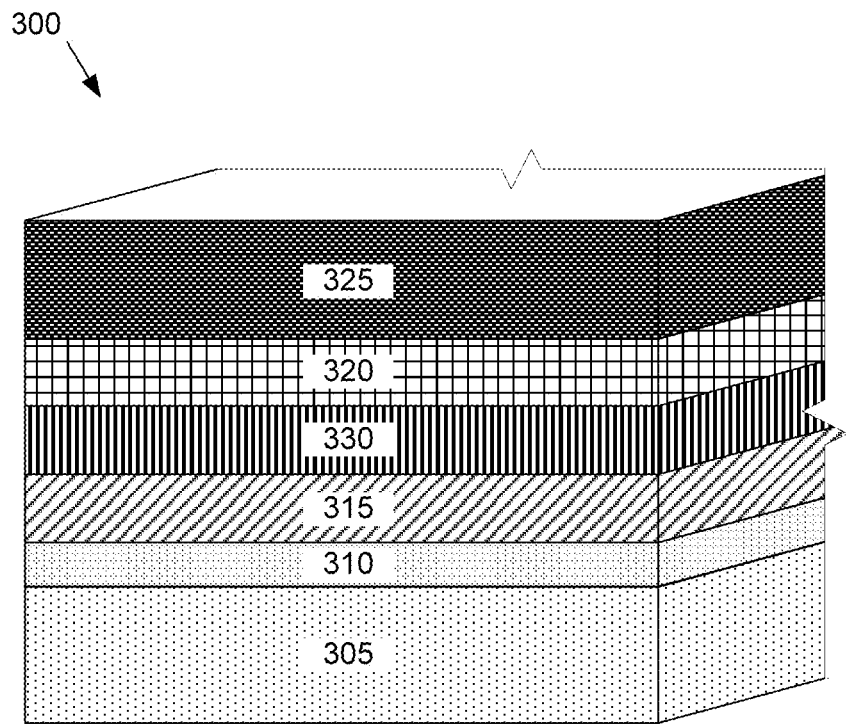
FIG. 3 depicts a schematic of functional layers in a second embodiment of a photovoltaic device.

In a second embodiment of a photovoltaic device 300, as depicted in FIG. 3, an interfacial layer of CdSSe 330 is deposited over a substrate structure including a base layer 305, TCO layer 310, and a CdS window layer 315. A p-type absorber layer of CdTe 320 is deposited over the CdSSe layer 330. The CdS window layer 315 and the CdSSe layer 330 together form the n-type region of the p-n junction with the p-type CdTe absorber layer 320. A metal back contact 325 is formed over the p-type CdTe layer 320. According to this second embodiment, the CdSSe interfacial layer 330 is formed of similar structure and using similar methods as the CdSSe window layer 230 in the previous embodiment. The CdS window layer 315 may be formed of a cadmium sulfide material that further includes impurities or dopants in the CdS bulk material. The CdS window layer 315 may be between 10 nm to 100 nm thick or alternatively between 30 nm to 75 nm thick. The CdS window layer 315 may be formed over the TCO layer 310 by a deposition process, such as vapor transport deposition, atomic layer deposition, chemical bath deposition, sputtering, closed space sublimation, or any other suitable process.

Figure 4:
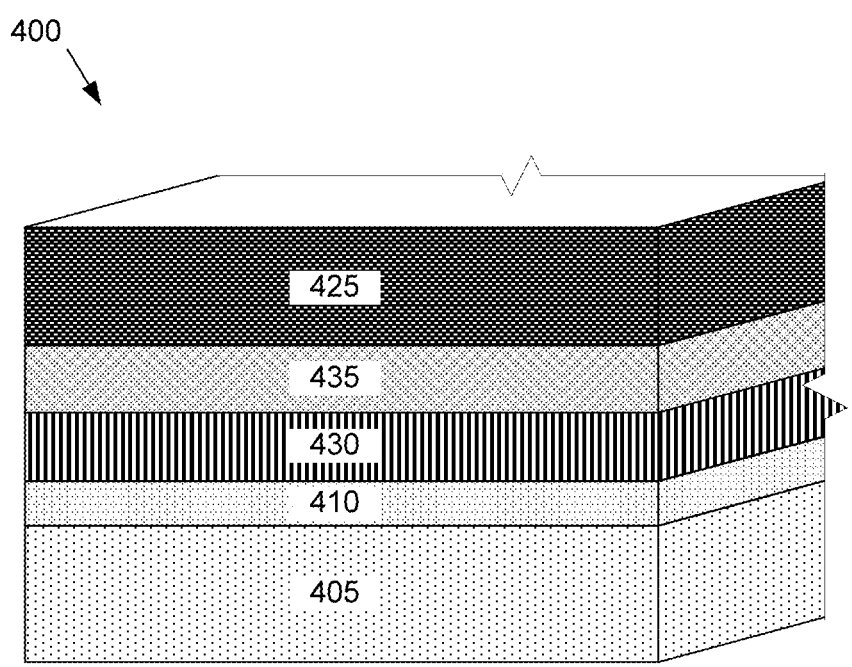
FIG. 4 depicts a schematic of functional layers in a third embodiment of a photovoltaic device.

In a third embodiment of a photovoltaic device 400, as depicted in FIG. 4, an n-type CdSSe window layer 430 is deposited over a substrate structure including a base layer 405 and a TCO layer 410. A cadmium sulphotelluride (CST)

p-type absorber layer 435 is deposited over the CdSSe layer 430. A metal back contact 425 is formed over the p-type CST absorber layer 435. The CST absorber layer 435 may be composed of cadmium sulfur and tellurium in varying amounts to form a $CdS_xTe_{1-x}$ compound, where x may be between 1 to 30 at %, or alternatively between 1 to 15 at %, or further alternatively between 2 to 10 at %. A CST absorber layer 435 may be between 500 to 8000 nm thick, or alternatively between 1000 nm to 3500 nm thick. A CST layer may be formed by a deposition process, such as vapor transport deposition, atomic layer deposition, chemical bath deposition, sputtering, closed space sublimation, or any other suitable process.

Figure 5:
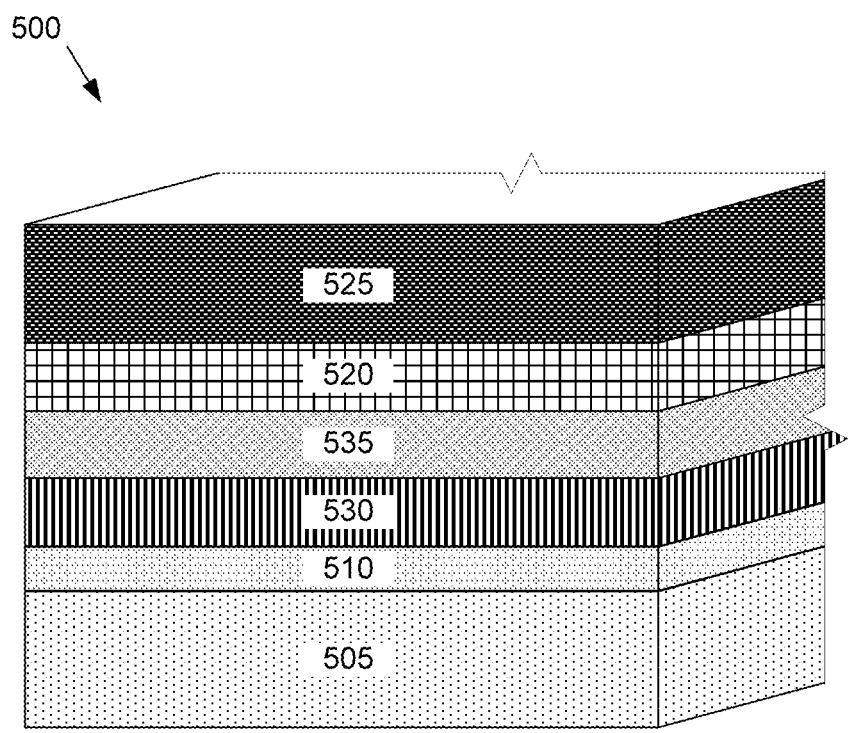
FIG. 5 depicts a schematic of functional layers in a fourth embodiment of a photovoltaic device.

In a fourth embodiment of a photovoltaic device 500, as depicted in FIG. 5, an n-type window layer of CdSSe 530 is deposited over a substrate structure including a base layer 505 and a TCO layer 510. A CST interfacial layer 535 is deposited over the n-type CdSSe window layer 530. A p-type CdTe absorber layer 520 is deposited over the CST interfacial layer 535. The CST interfacial layer 535 may be similarly composed of $CdS_xTe_{1-x}$ where x may be between 1 to 30 at %, or alternatively between 1 to 15 at %, or further alternatively between 2 to 10 at %. However, a CST interfacial layer 535 adjacent to the CdTe absorber layer 520 may be between 20 nm to 1000 nm thick, or alternatively may be between 400 nm to 600 nm thick. The CST interfacial layer 535 and the p-type CdTe absorber layer 520 together form the p-type region of the p-n junction with the n-type CdSSe window layer 530. A metal back contact 525 is formed over the p-type CdTe layer 520.

Figure 6:
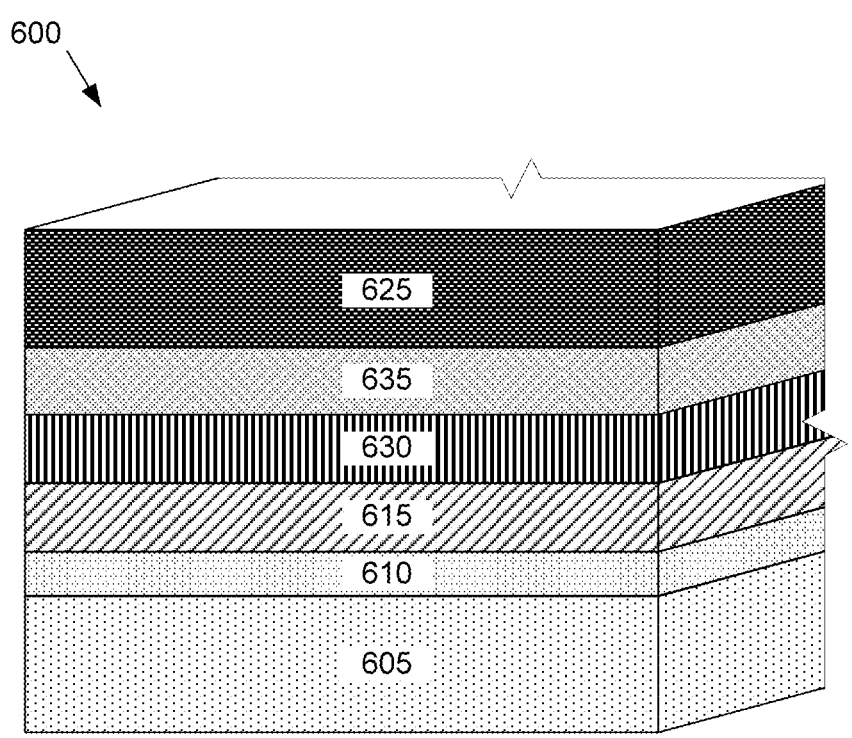
FIG. 6 depicts a schematic of functional layers in a fifth embodiment of a photovoltaic device.

In a fifth embodiment of a photovoltaic device 600, as depicted in FIG. 6, a CdSSe interfacial layer 630 is deposited over a substrate structure including a base layer 605, a TCO layer 610, and an n-type CdS window layer 615. A p-type CST absorber layer 635 is deposited over the CdSSe interfacial layer 630. The CdS window layer 615 and the CdSSe interfacial layer 630 together comprise the n-type region to form a p-n junction with the p-type CST absorber layer 635. A metal back contact 625 is formed over the p-type CdTe layer 620.

Figure 7:
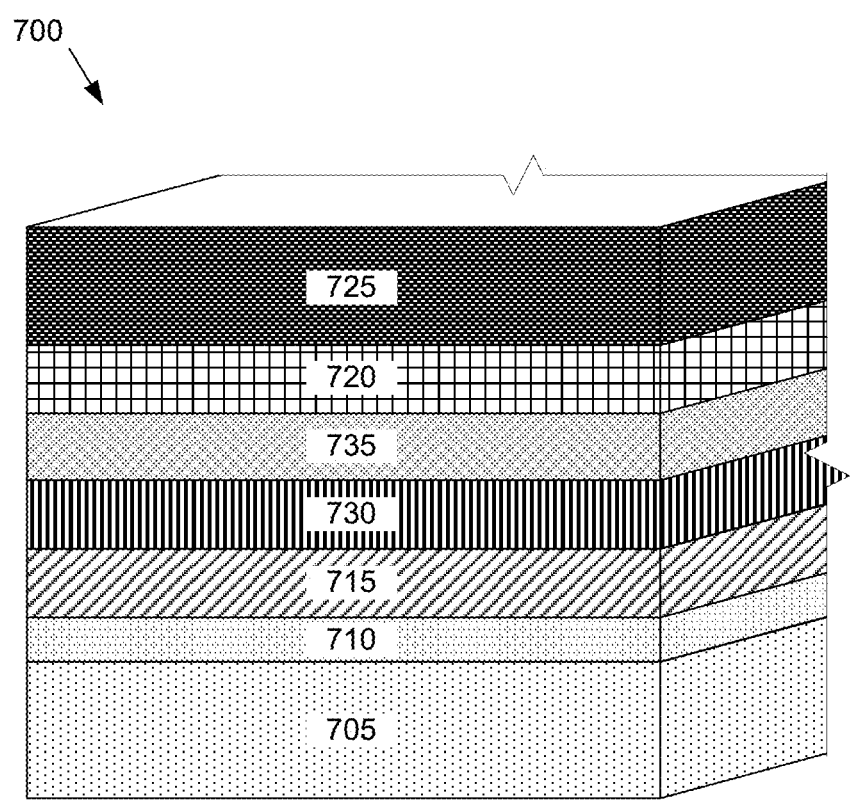
FIG. 7 depicts a schematic of functional layers in a sixth embodiment of a photovoltaic device.

In a sixth embodiment of a photovoltaic device 700, as depicted in FIG. 7, a CdSSe interfacial layer 730 is deposited over a substrate structure including a base layer 705, a TCO layer 710 and an n-type CdS window layer 715. A CST interfacial layer 735 is deposited over the CdSSe interfacial layer 730. A p-type CdTe absorber layer 720 is deposited over the CST interfacial layer 735. The p-type CdTe absorber layer 720 and the CST interfacial layer 735 together comprise the p-type region to form a p-n junction with the n-type CdS window layer 715 and the CdSSe interfacial layer 730, which together comprise the n-type region. A metal back contact 725 is formed over the p-type CdTe absorber layer 720.

Figure 10:
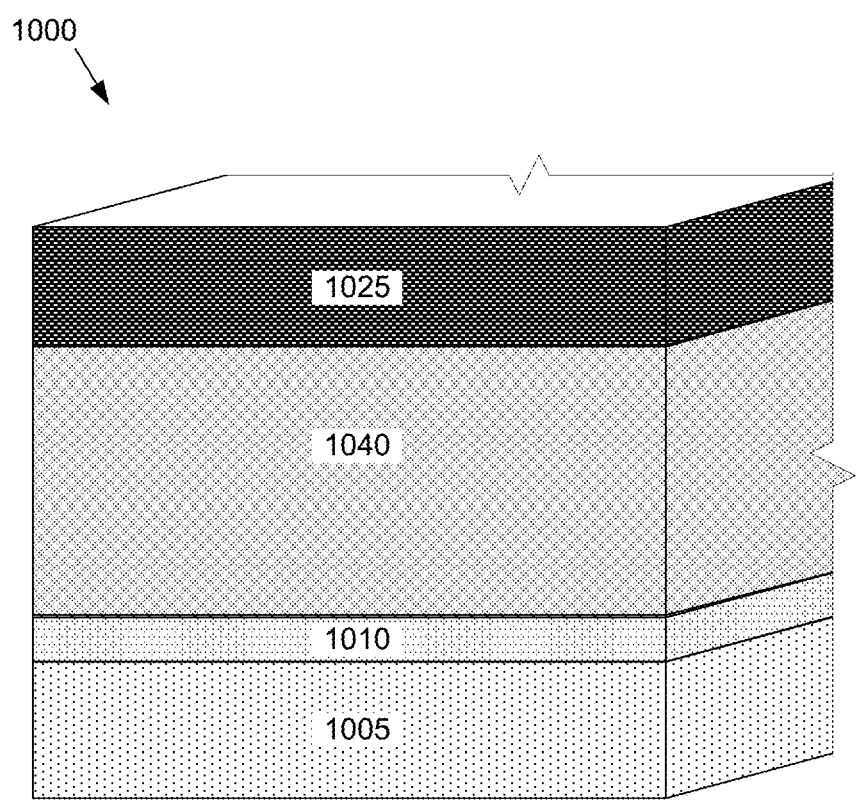
FIG. 10 depicts a schematic of functional layers in a seventh embodiment of a photovoltaic device.

According to a seventh embodiment of a photovoltaic device 1000, as depicted in FIG. 10, a TCO layer 1010 is formed on a base layer 1005. A p-type cadmium selenide telluride (CdSeTe) layer 1040 is formed over the TCO layer 1010. The TCO layer 1010 may include a material doped to be n-type in order to form a p-n junction with the p-type CdSeTe layer 1040. A metal back contact 1025 is formed over the p-type CdSeTe layer 1040.

The CdSeTe layer 1040, as a p-type absorber layer, preferably absorbs the photons passing through from the base layer 1005 and TCO layer 1010 to mobilize charge carriers. The thickness of the CdSeTe layer 1040 can be between about 2000 nm to 4000 nm thick or alternatively between about 2500 nm and 3500 nm thick. The CdSeTe layer 230 may be composed of cadmium, selenium, and tellurium in varying amounts to form a $CdSe_xTe_{1-x}$ compound, where x is in the range of about 1 to about 25 at %, or alternatively between about 5 to about 20 at %. The compositional ratio (at %) of a compound, for example $CdSe_xTe_{1-x}$, is determined by comparing the number of selenium atoms and the number of tellurium atoms in a given amount of the compound with the total sum of selenium and tellurium atoms in the given amount. For example, where x=10 at %, there are 9 tellurium atoms for every 1 selenium atom in a given amount of $CdSe_{10\%}Te_{90\%}$ compound.

The CdSeTe layer 1040 can be manufactured by a deposition process, such as vapor transport deposition, atomic layer deposition, chemical bath deposition, sputtering, closed space sublimation, or any other suitable process. In forming the CdSeTe layer 1040 using a process requiring the evaporation of powder, such as vapor transport deposition, the CdSeTe layer 1040 may be formed from the co-evaporation of a blended mixture of CdSe and CdTe powder, or the evaporation of a pre-alloyed CdSeTe powder. The composition of the blended powders for co-evaporation or the composition of a pre-alloyed powder can be tailored so that the as-deposited film achieves the desired $CdSe_xTe_{1-x}$ compositional ratio. Alternatively, a CdSeTe layer may be formed by sequentially depositing a CdSe layer followed by depositing a CdTe layer with a subsequent annealing or heat treatment process to allow alloying of the two layers to achieve the desired $CdSe_xTe_{1-x}$ compositional ratio. The annealing or heat treatment process may be a separate step in a manufacturing process or may occur concurrently with the subsequent deposition or annealing of a further layer of the photovoltaic device, for example the deposition of a metal back contact layer 1025 or annealing of CdTe absorber layer.

Although the disclosed embodiments may describe a CdSeTe layer as a single layer within the device, in each case the CdSeTe layer may comprise multiple layers of CdSeTe of varying composition to form a continuous or step-wise gradient of the selenium to tellurium ratio. For example, the CdSeTe layer 1040 may be formed as a single layer of $CdSe_xTe_{1-x}$ where x is held constant throughout the formation process. Alternatively, the CdSeTe layer 1040 may be formed sequentially as multiple layers of $CdSe_xTe_{1-x}$ where x varies in value for each of the sequentially formed layers. For example, a first $CdSe_xTe_{1-x}$ layer may be deposited where x=5 at %, and a second $CdSe_xTe_{1-x}$ layer may be deposited where x=10 at %. These two adjacent layers may together form the CdSeTe layer 1040. As a further alternative, the ratio of selenium to tellurium may be varied continuously throughout the formation process so that, for example, the composition of the formed $CdSe_xTe_{1-x}$ layer at a first end is x=5 at % and at a second end is x=10 at %, and where x varies continuously from 5 at % to 10% between the first and second ends. The whole of the formed layer having the continuous gradient may form the CdSeTe layer 1040.

Figure 11:
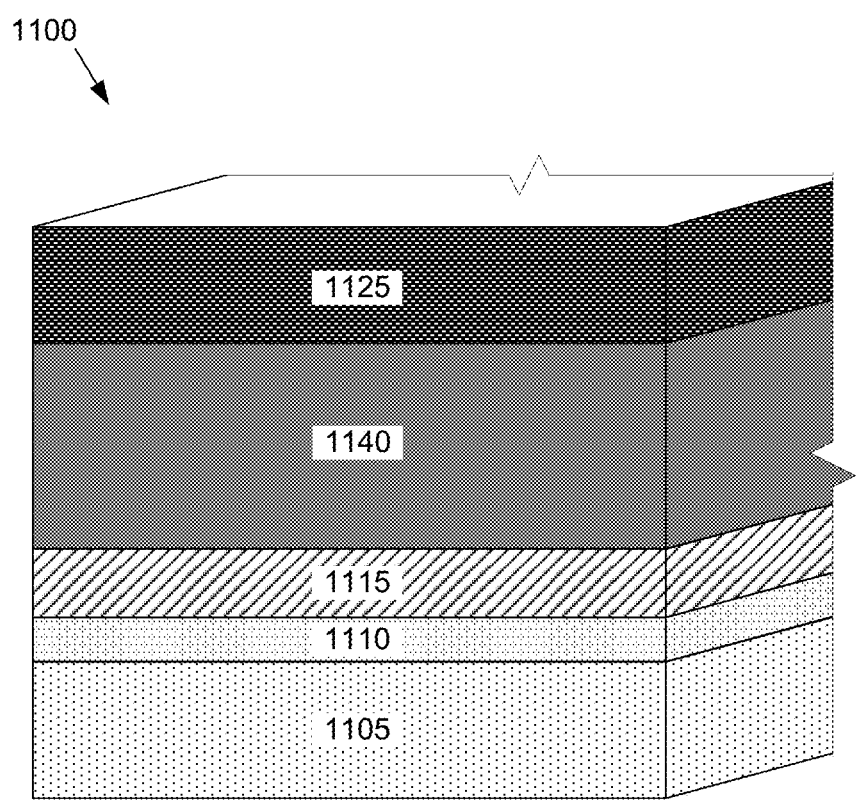
FIG. 11 depicts a schematic of functional layers in an eighth embodiment of a photovoltaic device.

According to an eighth embodiment of a photovoltaic device 1100, as depicted in FIG. 11, a CdS window layer 1115 is formed over a TCO layer 1110 over the base layer 1105. A p-type CdSeTe layer 1140 is formed over the CdS window layer 1115. The CdS window layer 1115 forms a p-n junction with the p-type CdSeTe layer 1140. A metal back contact 1125 is formed over the p-type CdSeTe layer 1140.

Figure 12:
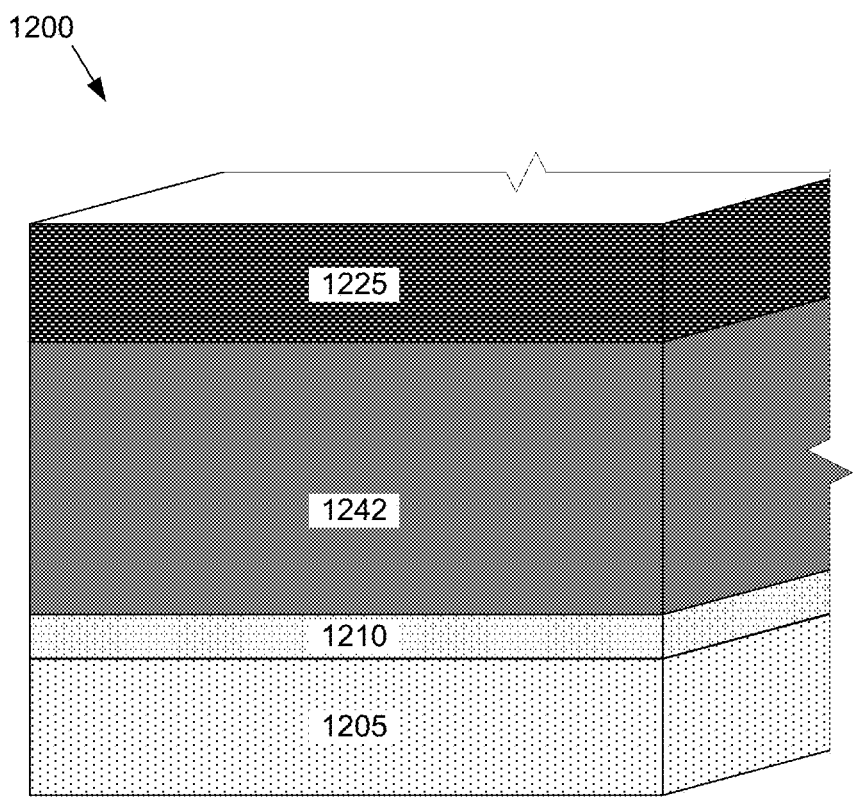
FIG. 12 depicts a schematic of functional layers in a ninth embodiment of a photovoltaic device.

According to a ninth embodiment of a photovoltaic device 1200, as depicted in FIG. 12, a TCO layer 1210 is formed over a base layer 1205. A cadmium sulfur selenide telluride (Cd(S,Se,Te)) layer 1242 is formed over the TCO layer

1210. A metal back contact 1225 is formed over the p-type CdSeTe layer 1242. The Cd(S,Se,Te) layer 1242 is formed from a compound of cadmium, sulfur, selenium, and tellurium, $CdS_ySe_xTe_{1-(x+y)}$ where 0>x>1, and 0>y>1, or alternatively where 0.02<x<0.25 and 0.02<y<0.25, or as a further alternative, where 0.05<x<0.20 and 0.02<y<0.05. The Cd(S,Se,Te) layer 1242 is between about 2000 nm to about 4000 nm thick, or alternatively between about 2500 nm to about 3500 nm thick.

In one embodiment, the Cd(S,Se,Te) layer 1242 comprises multiple sub-layers where x and y vary to provide preferred concentrations a various points through the layer thickness. For example, in one embodiment both x and y may vary to provide a higher sulfur and selenium concentration adjacent to the TCO layer 1210, and decrease throughout the thickness of the layer moving away from the TCO layer 1210. In other alternative embodiments, the value of x or y or both may remain constant throughout the Cd(S,Se,Te) layer 1242 between the TCO layer 1210 and metal back contact 1225.

The Cd(S,Se,Te) layer 1242 can be manufactured by a deposition process, such as vapor transport deposition, atomic layer deposition, chemical bath deposition, sputtering, closed space sublimation, or any other suitable process. In forming the Cd(S,Se,Te) layer 1242 using a process requiring the evaporation of powder, such as vapor transport deposition, the Cd(S,Se,Te) layer 1242 may be formed from the co-evaporation of a blended mixture of CdS, CdSe, and CdTe powders, or the evaporation of a pre-alloyed Cd(S, Se,Te) powder. The composition of the blended powders for co-evaporation or the composition of a pre-alloyed powder can be tailored so that the as-deposited film achieves the desired $CdS_ySe_xTe_{1-(x+y)}$ compositional ratio. Alternatively, a Cd(S,Se,Te) layer may be formed by sequentially depositing a CdS layer followed by depositing a CdSeTe layer, or various other combinations of compounds containing cadmium, sulfur, selenium and tellurium, with a subsequent annealing or heat treatment process to allow alloying of the two layers to achieve the desired $CdS_ySe_xTe_{1-(x+y)}$ compositional ratio. The annealing or heat treatment process may be a separate step in a manufacturing process or may occur concurrently with the subsequent deposition of a further layer of the photovoltaic device, for example the deposition of the metal back contact 1225.

Figure 13:
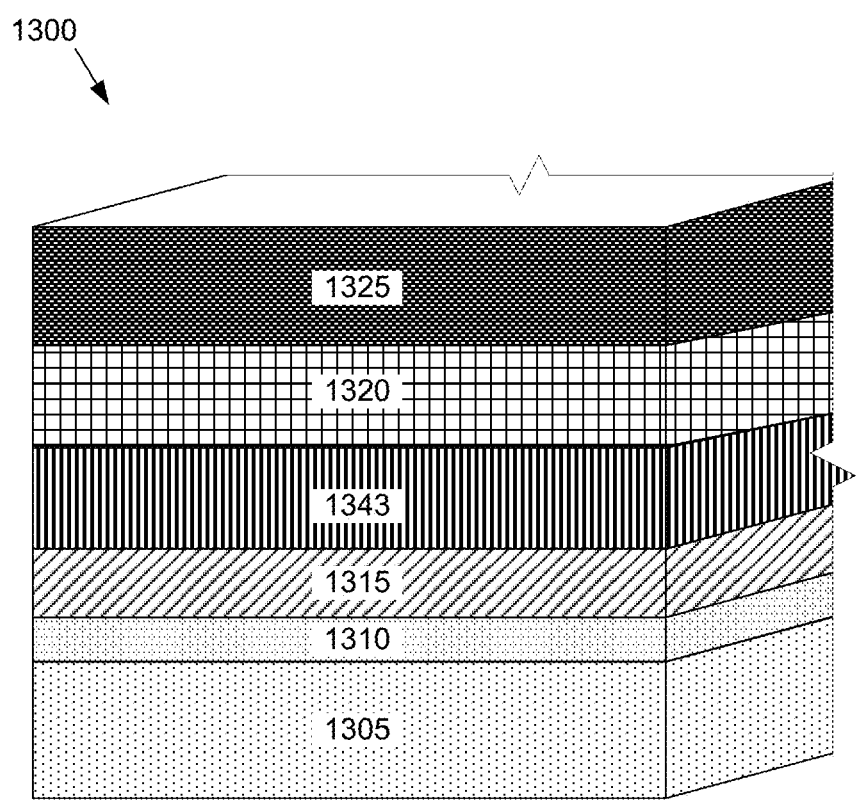
FIG. 13 depicts a schematic of functional layers in a tenth embodiment of a photovoltaic device.

According to a tenth embodiment of a photovoltaic device 1300, as depicted in FIG. 13, a TCO layer 1310 is formed over a base layer 1305. An n-type CdS window layer 1315 is formed over the TCO layer 1310. A p-type CdSeTe layer 1343 is formed over the CdS window layer 1315. A p-type CdTe absorber layer 1320 is formed over the CdSeTe layer 1343. A metal back contact 1325 is formed over the CdTe layer 1320. In this embodiment the CdSeTe layer 1343 may have a similar composition to the CdSeTe layer 1040 described above, and may be between about 250 nm and about 2500 nm thick, or alternatively between about 400 nm to about 1500 nm thick. The CdTe layer 1320 may be between about 250 nm and about 3500 nm thick, or alternatively between about 500 nm to about 2500 nm thick. The thickness of the CdSeTe layer 1343 and the thickness of the CdTe absorber layer 1320 together may be selected to form a total thickness of about 2000 nm to about 4000 nm thick, or alternatively of about 2500 nm to about 3500 nm thick.

As depicted in FIG. 13, the CdSeTe layer 1343 may be formed over the CdS window layer 1315, with the CdTe absorber layer 1320 formed over the CdSeTe layer 1343. In a further alternative (not shown), the CdS window layer 1315 may be omitted from the photovoltaic device 1300. As an additional alternative (not shown), the CdTe absorber layer 1320 may be formed over the CdS window layer 1315, with the CdSeTe layer 1343 formed over the CdTe layer 1320.

As the window, absorber, or interfacial layer of a photovoltaic module, the CdS, CdTe, CST, CdSeTe, and combinations thereof, are crystalline solids that can be sequentially formed in thin films on a substrate structure that may include a base layer, TCO, and additional buffer layers, barrier layers and coatings. According to the disclosed embodiments, a layer of CdSSe can be introduced in place of or in addition to a layer of CdS in the n-type region of the p-n junction within a photovoltaic device that further includes a p-type CdTe or CST, or both, in the p-type region of the p-n junction. According to further disclosed embodiments, a layer of CdSeTe can be introduced in place of, or in addition to, CdS or CdTe layers within a photovoltaic device.

Figure 8:
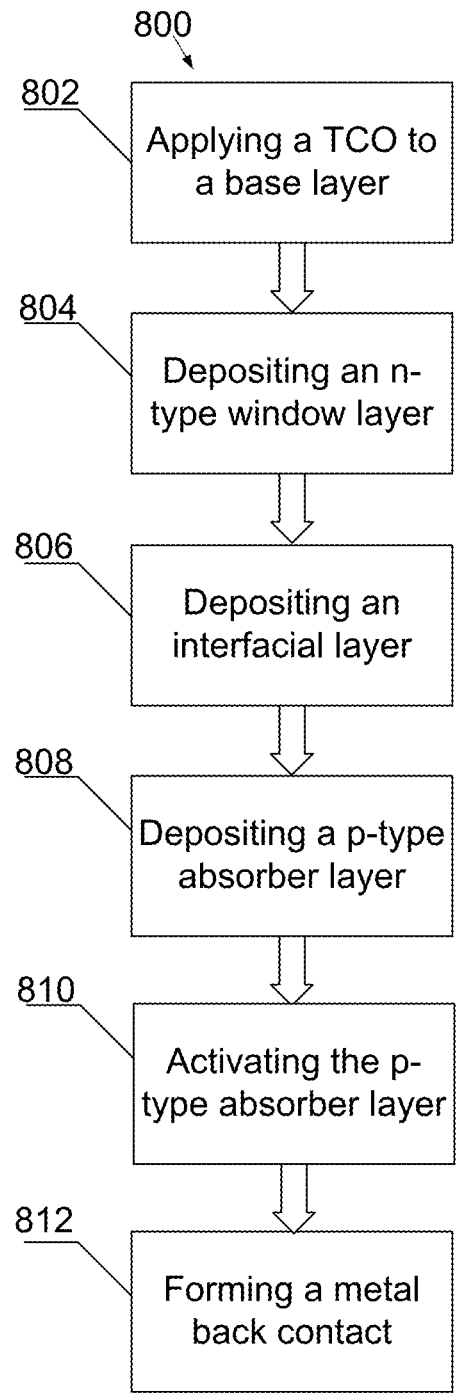
FIG. 8 depicts a process for manufacturing a photovoltaic device.

A method of manufacturing a photovoltaic structure, as depicted in FIG. 8, can include sequentially forming layers on a substrate. In a first step 802, a TCO layer can be formed on a base layer, such as glass. In a second step 804, an n-type window layer can be deposited over the substrate structure including the previously applied TCO layer and base layer. The n-type window layer may include an n-type CdS semiconductor, or an n-type CdSSe semiconductor, or may be omitted. In an optional third step 806, an interfacial layer can be deposited over the substrate structure including the previously applied n-type window layer, TCO layer, and base layer. The interfacial layer may include an n-type CdSSe semiconductor or a CST p-type semiconductor, or both semiconductors formed in sequence. In a fourth step 808, a p-type absorber layer can be deposited over the substrate structure including the optional interfacial layer(s), n-type window layer, TCO layer and base layer. The p-type absorber layer may include a p-type CdTe semiconductor, p-type CST semiconductor, or p-type CdSeTe semiconductor. In a fifth step 810, an activation process may be performed on the formed layers. In a sixth step 812, a metal back contact can be formed over the activated p-type absorber layer.

Figure 9:
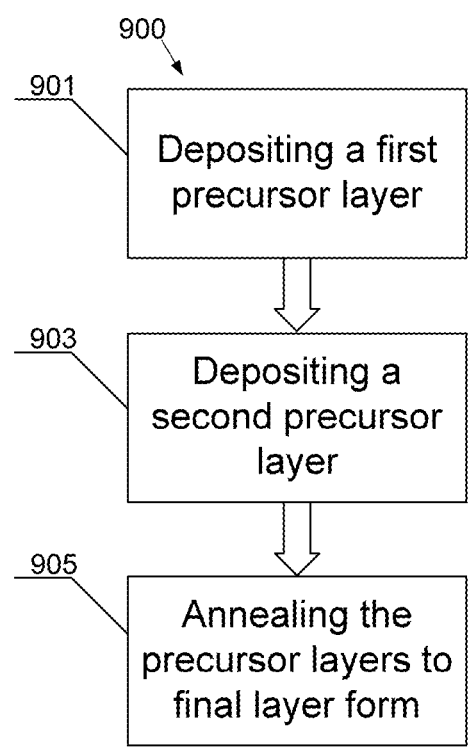
FIG. 9 depicts an expanded step of a process for manufacturing a layer in a photovoltaic device.

A step of the method of manufacturing a photovoltaic structure may include an expanded process as depicted in FIG. 9. The expanded process may be substituted for any step requiring the formation of a CdSSe layer, regardless whether window layer or interfacial layer, or the formation of a CdSeTe, or other layer comprising the deposition of a ternary (three-element) or quaternary (four-element) compound. In a first step 901 of the expanded process, a first precursor layer, for example CdS, is deposited over a substrate structure. In a second step 903 of the expanded process, a second precursor layer, for example cadmium selenide (CdSe), is deposited over the first precursor layer. In a third step 905 of the expanded process, the deposited precursor layers are annealed to form desired final layer form, for example CdSSe.

As noted, in one embodiment of the expanded process, the first step includes depositing a CdS layer as the first precursor layer over a substrate structure including a TCO layer and a base layer. The second step includes depositing a CdSe layer as the second precursor layer over the CdS layer. The third step includes annealing the deposited precursor layers to form a CdSSe layer of the desired $CdS_{1-x}Se_x$ compositional ratio. In an alternative embodiment of the expanded process, the first CdS precursor layer is deposited over a substrate structure including an additional n-type CdS window layer, TCO layer and a base layer. In a further alternative embodiment of the expanded process, the annealing of the precursor layers occurs during the subsequent deposition of a p-type CdTe absorber layer.

Subsequent to formation of the layers, the photovoltaic structure may go through an activation process. When a CdTe, CST, or CdSeTe, or other absorber layer is used, the activation step can include the introduction of a material containing chlorine to the semiconductor bi-layer, for example cadmium chloride ($CdCl_2$) as a bathing solution, spray, or vapor, and an associated annealing of the absorber layer at an elevated temperature. For example, if $CdCl_2$ is used, the $CdCl_2$ can be applied over the absorber layer as an aqueous solution at a concentration of about 50 to about 500 g/L. Alternatively, the absorber layer can be annealed with $CdCl_2$ by continuously flowing $CdCl_2$ vapor over the surface of the absorber layer during the anneal. Alternative chlorine-doping materials can also be used such as $MnCl_2$, $MgCl_2$, $NHCl_2$, $ZnCl_2$, or $TeCl_2$. A typical anneal can be performed at a temperature of about 350°-450° C. for a total duration of 90 minutes or less, with a soaking time equal to or less than about 60 minutes.

Inclusion of the CdSSe layer can serve to protect the CdS window layer, if included as an interfacial layer between the CdS and the CdTe layers, during the activation step thus preventing the CdS material of the window layer from excessively intermixing into the into the CdTe layer. As a result, more aggressive activation conditions (e.g., more $CdCl_2$ dopant and/or higher annealing temperatures and/or longer annealing durations) can be used in order to improve the CdTe absorber layer without affecting the integrity of the CdS material of the window layer. For example, when the interfacial layer is included, a higher temperature anneal of about 415° C. to about 485° C. for a $CdCl_2$ activation can be used (with or without a corresponding shortened anneal time) or the duration of the anneal can be lengthened (with or without a corresponding temperature increase), while also increasing the amount of Cl applied if desired.

For each of the embodiments describing various PV stacks incorporating a CdSSe, or CdSeTe layer above, multi-step activation processes or single activation steps may be used. With each desired activation mechanism such as semiconductor grain growth, chlorine diffusion, sulfur and selenium inter-diffusion into the layers, a different thermal activation energy is required. Using a multi-step process allows each activation mechanism to be optimized.

As an example of a multi-step activation process, $CdCl_2$ can be applied in a single step followed by annealing using a multi-step temperature profile. For example, the anneal temperature may be ramped up to 425° C. first, held there for a period of time (e.g. 1-10 minutes) and then ramped up further to 450°-460° C. and held there for an additional period of time (e.g., 1-10 minutes) before ramping the anneal temperature back down. This temperature profile for the above anneal results in different crystallinity characteristics of the CdTe material than those of a device activated in a single anneal step at 425° C. or alternatively at 450°-460° C. As an extension or alternative to this approach, multiple $CdCl_2$ applications, each paired with annealing at varied times and temperatures may also be used to achieve desired layer characteristics.

In addition, during the activation step, the CdSSe layer, when used either as the window layer or as an interfacial layer between a CdS window layer and a CdTe absorber layer, may diffuse into the CdTe absorber layer, thereby forming a graded $CdS_xTe_ySe_z$ layer at the interface between the interfacial layer and the absorber layer, where 0<x<1, 0<y<1, 0<z<1 at %.

From the foregoing description, one ordinarily skilled in the art can easily ascertain the essential characteristics of this present embodiments and, without departing from the spirit and scope thereof, can make various changes and modifications to the embodiments described herein to adapt it to various usages and conditions.

What is claimed is:

1. A method for forming a photovoltaic structure, comprising:
   providing a substrate structure comprising a transparent conductive oxide (TCO) layer;
   forming a CdSeTe layer over the substrate structure;
   alloying the CdSeTe layer whereby an absorber layer is formed over the substrate structure, wherein:
      the absorber layer comprises a p-type cadmium selenide telluride layer,
      the p-type cadmium selenide telluride layer is composed of a $CdSe_xTe_{1-x}$ compound, wherein a value of x is between 0 and 1; and
   forming a back contact over the absorber layer;
   wherein:
      the absorber layer has a compositional profile having a gradient of selenium, wherein a concentration of Se is greater adjacent the TCO layer than adjacent the back contact; and
      the step of forming the CdSeTe layer includes sequentially depositing a CdSe layer followed by depositing a CdTe layer.

2. The method of claim 1, wherein the step of forming the CdSeTe layer comprises depositing multiple layers by vapor transport deposition.

3. The method of claim 1, wherein the $CdSe_xTe_{1-x}$ layer, has a compositional gradient wherein x varies across a thickness of the $CdSe_xTe_{1-x}$ layer, and wherein x has a value within a range of 0.01 to 0.25.

4. The method of claim 1, further comprising depositing a CdTe layer over the CdSeTe layer, wherein a thickness of the CdTe layer is between about 250 nm to about 3500 nm.

5. The method of claim 1, wherein a thickness of the absorber layer is between 1000 nm to 3500 nm.

6. The method of claim 1, wherein the $CdSe_xTe_{1-x}$ compound has a compositional profile such that x varies in value through a thickness of the cadmium selenide telluride layer, and the value of x is in a range of 0.01 to 0.40.

7. The method of claim 1, further comprising incorporating a dopant into the absorber layer.

8. The method of claim 1, wherein the alloying step occurs concurrently with the step of depositing the CdSeTe layer over the substrate structure.

9. The method of claim 1, wherein the alloying step occurs after the step of depositing the CdSeTe layer over the substrate structure.

10. The method of claim 1, wherein the p-type cadmium selenide telluride layer of the absorber layer forms a p-n junction with the substrate structure, wherein the substrate structure does not include a window layer comprising CdS, and wherein the substrate structure does not include a window layer comprising CdSSe.

11. The method of claim 1, wherein the alloying step further comprises:
   annealing with a $CdCl_2$ flux at a temperature in a range from 420° C. to 460° C. for a duration in a range from five minutes to sixty minutes.

12. The method of claim 1, further comprising an activation step of contacting a material containing chlorine to the CdSeTe layer, and annealing the absorber layer.

13. The method of claim 12, wherein the material containing chlorine comprises an aqueous solution of $CdCl_2$, wherein the aqueous solution has a concentration in a range of 50 g/L to 500 g/L.

14. The method of claim 12, wherein the activation step comprises contacting the CdSeTe layer with $CdCl_2$ and another material containing chlorine.

15. The method of claim 12, wherein the activation step comprises contacting the CdSeTe layer with $CdCl_2$ and another material containing chlorine selected from the group consisting of: $MnCl_2$, $MgCl_2$, $NHCl_2$, $ZnCl_2$, or $TeCl_2$.

16. The method of claim 1, wherein the back contact comprises an ohmic electrode comprising an electrically conductive material.

17. A method for forming a photovoltaic structure, comprising:
providing a substrate structure comprising a transparent conductive oxide (TCO) layer;
forming a CdSeTe layer over the substrate structure;
alloying the CdSeTe layer whereby an absorber layer is formed over the substrate structure, wherein:
the absorber layer comprises a p-type cadmium selenide telluride layer,
the p-type cadmium selenide telluride layer is composed of a $CdSe_xTe_{1-x}$ compound, wherein a value of x is between 0 and 1; and
forming a back contact over the absorber layer;
wherein:
the absorber layer has a compositional profile having a gradient of selenium, wherein a concentration of Se is greater adjacent the TCO layer than adjacent the back contact; and
wherein the step of depositing the CdSeTe layer includes sequentially depositing a CdSe layer over the substrate structure, followed by depositing a CdTe layer, and wherein the alloying step occurs after the step of depositing the CdTe layer over the CdSe layer.

18. The method of claim 17, wherein the step of forming the CdSeTe layer comprises depositing multiple layers by vapor transport deposition.

19. The method of claim 17, wherein the $CdSe_xTe_{1-x}$ layer, has a compositional gradient wherein x varies across a thickness of the $CdSe_xTe_{1-x}$ layer, and wherein x has a value within a range of 0.01 to 0.25.

20. The method of claim 17, further comprising depositing a CdTe layer over the CdSeTe layer, wherein a thickness of the CdTe layer is between about 250 nm to about 3500 nm.

21. The method of claim 17, wherein a thickness of the absorber layer is between 1000 nm to 3500 nm.

22. The method of claim 17, wherein the $CdSe_xTe_{1-x}$ compound has a compositional profile such that x varies in value through a thickness of the cadmium selenide telluride layer, and the value of x is in a range of 0.01 to 0.40.

23. The method of claim 17, further comprising incorporating a dopant into the absorber layer.

24. The method of claim 17, wherein the alloying step occurs concurrently with the step of depositing the CdSeTe layer over the substrate structure.

25. The method of claim 17, wherein the alloying step occurs after the step of depositing the CdSeTe layer over the substrate structure.

26. The method of claim 17, wherein the p-type cadmium selenide telluride layer of the absorber layer forms a p-n junction with the substrate structure, wherein the substrate structure does not include a window layer comprising CdS, and wherein the substrate structure does not include a window layer comprising CdSSe.

27. The method of claim 17, wherein the alloying step further comprises:
annealing with a $CdCl_2$ flux at a temperature in a range from 420° C. to 460° C. for a duration in a range from five minutes to sixty minutes.

28. The method of claim 17, further comprising an activation step of contacting a material containing chlorine to the CdSeTe layer, and annealing the absorber layer.

29. The method of claim 28, wherein the material containing chlorine comprises an aqueous solution of $CdCl_2$, wherein the aqueous solution has a concentration in a range of 50 g/L to 500 g/L.

30. The method of claim 28, wherein the activation step comprises contacting the CdSeTe layer with $CdCl_2$ and another material containing chlorine.

31. The method of claim 28, wherein the activation step comprises contacting the CdSeTe layer with $CdCl_2$ and another material containing chlorine selected from the group consisting of: $MnCl_2$, $MgCl_2$, $NHCl_2$, $ZnCl_2$, or $TeCl_2$.

32. The method of claim 17, wherein the back contact comprises an ohmic electrode comprising an electrically conductive material.

* * * * *